(12) United States Patent
Jeong et al.

(10) Patent No.: US 10,593,401 B2
(45) Date of Patent: Mar. 17, 2020

(54) MEMORY DEVICE AND SIGNAL LINE LAYOUT THEREOF

(71) Applicant: SK hynix Inc., Gyeonggi-do (KR)

(72) Inventors: Seung-Gyu Jeong, Gyeonggi-do (KR); Kyu-Sung Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/161,247

(22) Filed: Oct. 16, 2018

(65) Prior Publication Data

US 2019/0279710 A1    Sep. 12, 2019

(30) Foreign Application Priority Data

Mar. 12, 2018 (KR) .................. 10-2018-0028616

(51) Int. Cl.
  *G11C 13/00* (2006.01)
(52) U.S. Cl.
  CPC ...... *G11C 13/0033* (2013.01); *G11C 13/0004* (2013.01); *G11C 13/0023* (2013.01); *G11C 13/0026* (2013.01); *G11C 13/0028* (2013.01); *G11C 13/0069* (2013.01); *G11C 2213/79* (2013.01)
(58) Field of Classification Search
  CPC ............ G11C 13/0033; G11C 13/0004; G11C 13/0023

USPC .......................... 365/230.01, 230.02, 230.03
See application file for complete search history.

(56) References Cited

U.S. PATENT DOCUMENTS

| | | | | |
|---|---|---|---|---|
| 2010/0246247 A1* | 9/2010 | Kim | ............... | G11C 13/0004 365/163 |
| 2013/0279249 A1* | 10/2013 | Yun | ..................... | G11C 16/10 365/185.03 |
| 2015/0279439 A1* | 10/2015 | Pyo | ..................... | G11C 5/06 365/72 |

FOREIGN PATENT DOCUMENTS

KR     1020090074431      7/2009

* cited by examiner

*Primary Examiner* — Han Yang
(74) *Attorney, Agent, or Firm* — IP & T Group LLP

(57) ABSTRACT

A memory device includes a plurality of memory regions including memory cells coupled between a plurality of word lines and a plurality of bit lines, an address decoder suitable for decoding an address to generate a plurality of selection signals corresponding to the bit lines, and outputting the selection signals to a plurality of signal lines, and a plurality of selection circuits corresponding to the memory regions, respectively, and suitable for selecting the bit lines in response to the selection signals received through the signal lines, wherein at least one of the selection circuits is coupled to the signal lines in an arrangement different from remaining selection circuits.

19 Claims, 4 Drawing Sheets

MEMORY DEVICE AND SIGNAL LINE LAYOUT THEREOF

CROSS-REFERENCE TO RELATED APPLICATION

This application claims priority under 35 U.S.C. § 119 to Korean Patent Application No. 10-2018-0028616, filed on Mar. 12, 2018, in the Korean Intellectual Property Office, the disclosure of which is incorporated herein by reference in its entirety.

BACKGROUND

1. Field

Various embodiments of the present invention relate to a memory device, and more particularly, to signal lines of a plurality of memory regions included in a memory device.

2. Description of the Related Art

Generally, a memory device may be either a volatile memory device or a nonvolatile memory device.

A volatile memory device has high write and read speeds, but loses data stored therein when power is turned or cut off. Examples of a volatile memory device include a dynamic random access memory (DRAM), and a static RAM (SRAM). On the other hand, a nonvolatile memory device has comparatively low write and read speeds, but retains data stored therein even when power is cut off. Therefore, a nonvolatile memory device is used when there is a need for storing data which should be retained regardless of the supply of power. Examples of a nonvolatile memory device include a read only memory (ROM), a mask ROM (MROM), a programmable ROM (PROM), an erasable programmable ROM (EPROM), an electrically erasable programmable ROM (EEPROM), a flash memory, a phase change random access memory (PCRAM), a magnetic RAM (MRAM), a resistive RAM (RRAM), and a ferroelectric RAM (FRAM). A flash memory device may be a NOR-type memory device or a NAND-type memory device.

Among the memory devices, the PCRAM has a limited write endurance. The write endurance may be defined as the number of write (i.e., program) cycles that can be applied to a memory region before the storage medium of the device loses its reliability. Consequently, the life of a memory device may be reduced when write operations are concentrated on a specific memory region. In order to prevent this, the write operations performed on the memory region are counted, and data of a memory region which are frequently used and data of the memory region which are not frequently used are exchanged so that the entire memory region of the memory device can be used evenly.

Also, because of the continued increase in the degree of integration of memory devices, the interval between adjacent memory cells in the memory device has been reduced, which may result in malfunction due to an increase of a coupling effect between the adjacent memory cells. For example, a disturbance phenomenon, where data of a memory cell on which a write operation is performed as well as data of memory cells adjacent to the memory cell are corrupted due to heat generated during the write operation, may occur. To prevent this phenomenon, the write operations performed on the memory region may be counted, and data of the memory region which is frequently used may be restored through a scrubbing operation using an error correction code (ECC).

SUMMARY

Various embodiments of the present invention are directed to a memory device capable of reducing a disturbance phenomenon occurring in memory regions through a write operation.

In accordance with an embodiment of the present invention, a memory device includes: a plurality of memory regions including memory cells coupled between a plurality of word lines and a plurality of bit lines; an address decoder suitable for decoding an address to generate a plurality of selection signals corresponding to the bit lines, and outputting the selection signals to a plurality of signal lines; and a plurality of selection circuits corresponding to the memory regions, respectively, and suitable for selecting the bit lines in response to the selection signals received through the signal lines, wherein at least one of the selection circuits is coupled to the signal lines in an arrangement different from remaining selection circuits.

In accordance with an embodiment of the present invention, a memory device includes: a plurality of memory regions including memory cells coupled between N word lines and N bit lines, where N is a natural number equal to or greater than 3; an address decoder suitable for decoding an address to generate first to $N^{th}$ selection signals corresponding to the bit lines; and a plurality of selection circuits corresponding to the memory regions, respectively, and suitable for selecting the bit lines in response to the first to $N^{th}$ selection signals, wherein the selection circuits includes: a first selection circuit suitable for selecting neighboring bit lines among the bit lines in response to first and second selection signals among the first to $N^{th}$ selection signals; and a second selection circuit suitable for selecting neighboring bit lines among the bit lines in response to the first selection signal and a $(K+1)^{th}$ selection signal among the first to $N^{th}$ selection signals, where K is a natural number greater than 1 and equal to or less than N/2−1.

In accordance with an embodiment of the present invention, a method of operating a memory device having a plurality of memory regions includes: decoding an address, using an address decoder, to generate a plurality of selection signals respectively corresponding to a plurality of bit lines; outputting the selection signals to a plurality of signal lines; and selecting the bit lines in response to the selection signals received through the signal lines, wherein at least one of a plurality of selection circuits, which respectively correspond to the plurality of memory regions, is coupled to the signal lines in an arrangement different from remaining selection circuits.

DETAILED DESCRIPTION

Various embodiments of the present invention will be described below in more detail with reference to the accompanying drawings. These embodiments are provided so that this disclosure is thorough and complete. Each "embodiment" referred to in this disclosure refer to one or more embodiments of the inventive concept disclosed herein. Moreover, different references to "an embodiment" or the like are not necessarily to the same embodiment(s). The embodiments presented are merely examples and are not intended to limit the scope of the invention.

Moreover, it is noted that the terminology used herein is for the purpose of describing the embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through one or more intermediate components.

It will be understood that, although the terms "first", "second", "third", and so on may be used herein to identify various elements, these elements are not limited by these terms. These terms are used to distinguish one element from another element that otherwise have the same or similar names. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
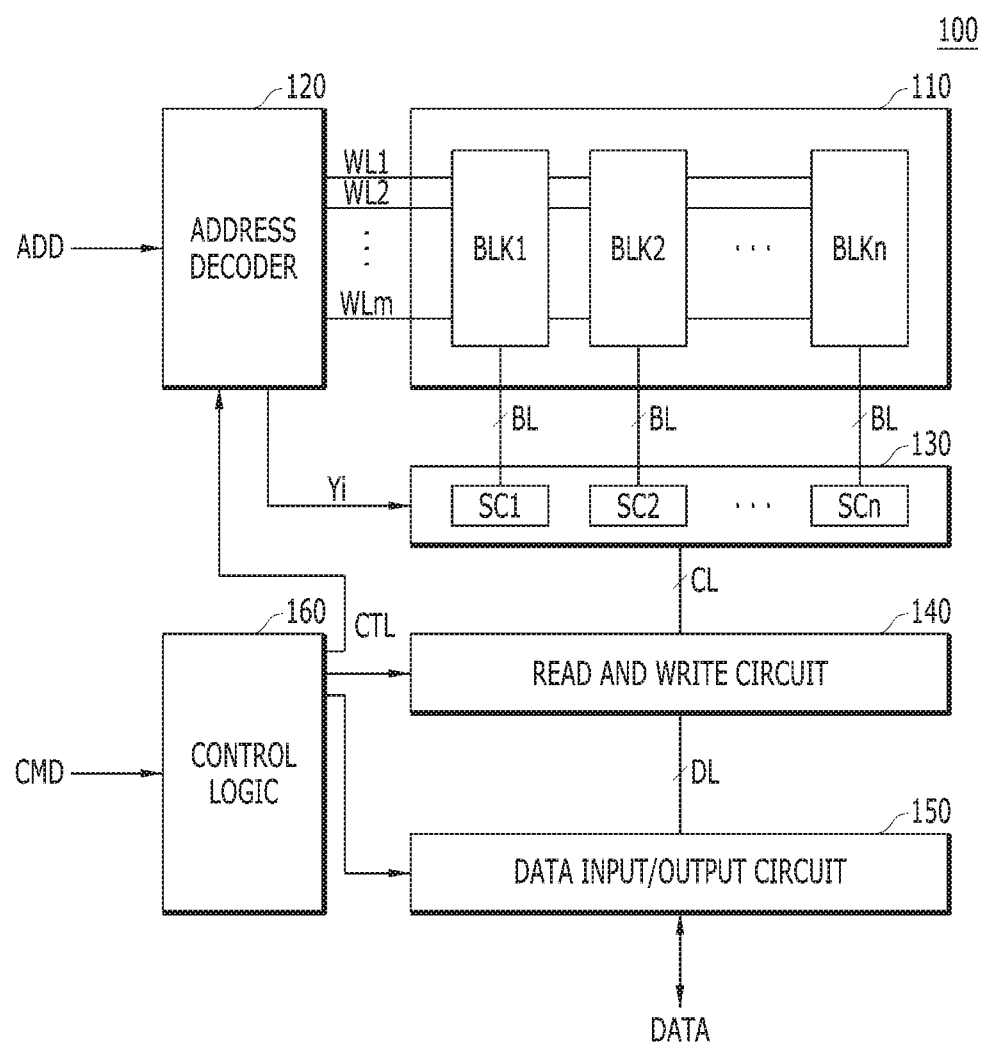
FIG. 1 is a block diagram illustrating a memory device in accordance with an embodiment of the present invention.

FIG. 1 is a block diagram illustrating a memory device 100 in accordance with an embodiment of the present invention. Referring to FIG. 1, the memory device 100 may include a memory cell array 110, an address decoder 120, a bit line selection circuit 130, a read and write circuit 140, a data input and output (input/output) circuit 150, and a control logic 160.

The memory cell array 110 may include a plurality of memory regions, that is, a plurality of memory blocks BLK1 to BLKn. The memory blocks BLK1 to BLKn may be coupled to the address decoder 120 through word lines WL1 to WLm. In addition, the memory blocks BLK1 to BLKn may be coupled to the bit line selection circuit 130 through bit lines BL. Each of the memory blocks BLK1 to BLKn may include a plurality of cell mats comprised of a plurality of memory cells.

The address decoder 120 may decode an address ADD received from an external device (e.g., a memory controller), and generate addresses for selecting the word lines WL1 to WLm and the bit lines BL. The address ADD may be divided into a row address for selecting the word lines WL1 to WLm and a column address for selecting of the bit lines BL. The address decoder 120 may decode the address ADD to generate selection signals Yi corresponding to the bit lines BL.

The bit line selection circuit 130 may include a plurality of selection circuits SC1 to SCn corresponding to the memory blocks BLK1 to BLKn, respectively. The selection circuits SC1 to SCn may select the bit lines BL in response to the selection signals Yi received from the address decoder 120. The bit line selection circuit 130 may couple the selected bit lines BL to column lines CL.

The read and write circuit 140 may operate under the control of the control logic 160. During read and write operations, the read and write circuit 140 may exchange data DATA with the data input/output circuit 150 through data lines DL.

During the read operation, the read and write circuit 140 may operate as a sense amplifier to read the data DATA from memory cells of the memory cell array 110 through selected bit lines BL and column lines CL. Subsequently, the read and write circuit 140 may output the data DATA through the data lines DL. During the write operation, the read and write circuit 140 may receive the data DATA through the data lines DL. Subsequently, the read and write circuit 140 may operate as a write driver to store the data DATA in memory cells of the memory cell array 110 through selected bit lines BL and column lines CL.

The data input/output circuit 150 may be coupled to the read and write circuit 140 through the data lines DL. The data input/output circuit 150 may operate under the control of the control logic 160. The data input/output circuit 150 may exchange the data DATA with an external or internal input/output buffer (not illustrated) of the memory device 100.

The control logic 160 may receive a command CMD from the external device or internal input/output buffer (not illustrated) of the memory device 100. The control logic 160 may generate a control signal CTL for controlling various operations of the memory device 100 in response to the command CMD. The control logic 160 may control the address decoder 120, the read and write circuit 140 and the data input/output circuit 150.

Although not illustrated in FIG. 1, the memory device 100 may further include the input/output buffer. The input/output buffer may receive the command CMD and the address ADD from the external device, and transmit the command CMD and the address ADD to the control logic 160 and the address decoder 120, respectively. In addition, the input/output buffer may receive the data DATA from the external device, and transmit the data DATA to the data input/output circuit 150. The input/output buffer may transmit the data DATA received from the data input/output circuit 150 to the external device.

Figure 2:
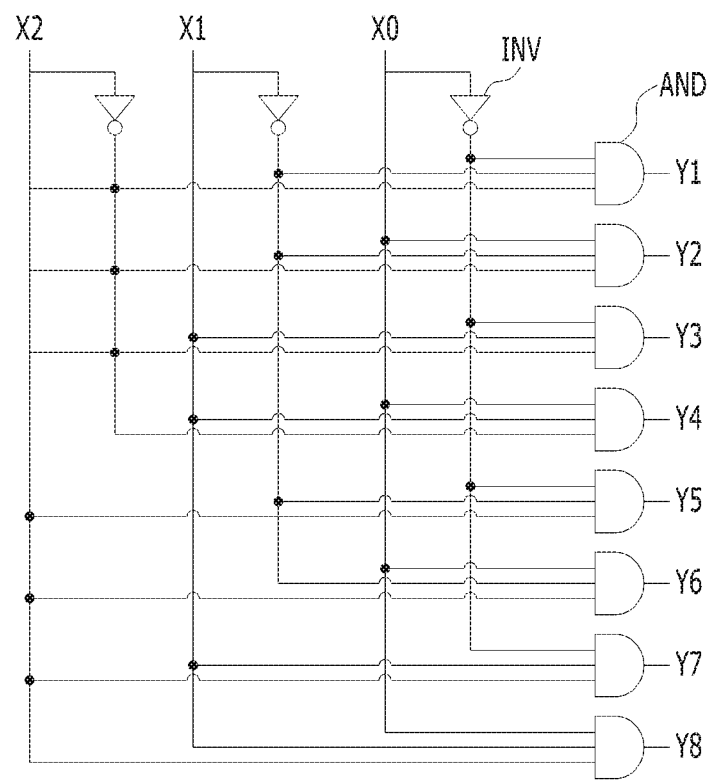
FIG. 2 is a circuit diagram illustrating an address decoder in accordance with an embodiment of the present invention.

FIG. 2 is a circuit diagram illustrating an address decoder in accordance with an embodiment of the present invention, for example, the address decoder 120 shown in FIG. 1. FIG. 2 mainly shows applicable structure of the address decoder 120 for decoding column addresses.

The address decoder 120 may decode some bits X0 to X2 of the address ADD, for example, the column addresses to generate selection signals Y1 to Y8 corresponding to the bit lines BL. Although FIG. 2 illustrates, as an example, a structure of the address decoder 120 for performing a 3-to-8 decoding operation, the present invention is not limited thereto.

In other words, the number of input addresses or output signals allocated to the address decoder 120 may be varied, and the address decoder 120 may be comprised of logic circuits combined in various ways, even if the number of addresses is the same as the number of signals. FIG. 2 illustrates as an example that the address decoder 120 is comprised of a plurality of inverters INV and a plurality of AND gates AND. Moreover, and by way of example, it is described that the memory blocks BLK1 to BLKn of FIG. 1 include eight bit lines BL1 to BL8 based on the eight selection signals Y1 to Y8.

The address decoder 120 may decode the addresses X0 to X2 to generate the selection signals Y1 to Y8 corresponding to the bit lines BL1 to BL8. The address decoder 120 may output the selection signals Y1 to Y8 to first to eighth signal lines. The address decoder 120 may be coupled to the selection circuits SC1 to SCn of FIG. 1 through the signal lines, and transmit the selection signals Y1 to Y8 through the signal lines.

Figure 3:
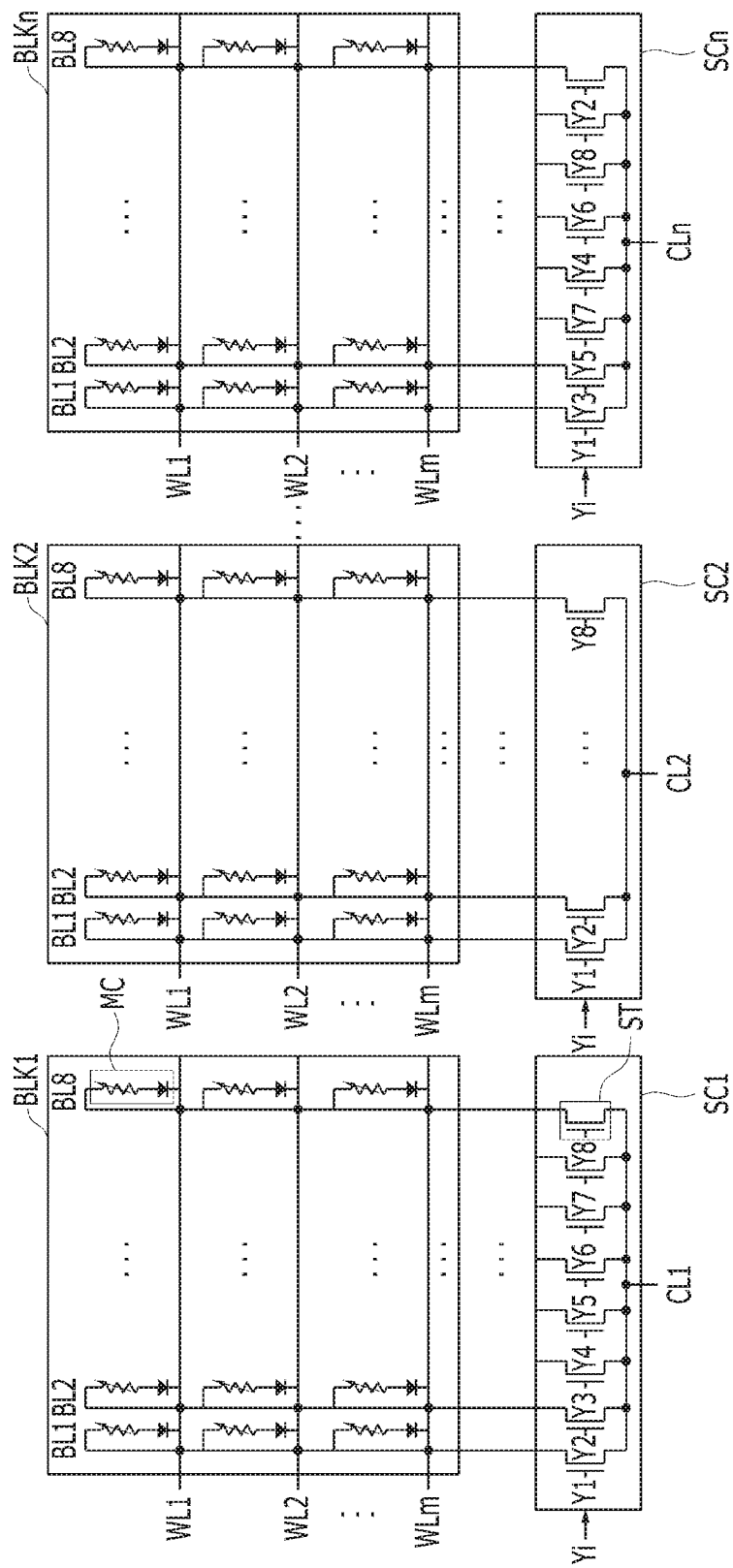
FIG. 3 is a circuit diagram illustrating a plurality of memory blocks and a plurality of selection circuits in accordance with an embodiment of the present invention.

FIG. 3 is a circuit diagram illustrating memory blocks and selection circuits in accordance with an embodiment of the present invention, for example, the memory blocks BLK1 to BLKn and the selection circuits SC1 to SCn shown in FIG. 1.

Referring to FIG. 3, each of the memory blocks BLK1 to BLKn may include the plurality of word lines WL1 to WLm and the plurality of bit lines (e.g., 8 bit lines BL1 to BL8) intersecting the word lines WL1 to WLm. Each of the memory blocks BLK1 to BLKn may include memory cells MC coupled between the word lines WL1 to WLm and the bit lines BL1 to BL8. The memory cells MC may be arranged in a form of a matrix in intersection regions of the word lines WL1 to WLm and the bit lines BL1 to BL8 to form a single memory cell mat. The memory blocks BLK1 to BLKn may include a plurality of memory cell mats. Since the memory cell mats have the same structure, FIG. 3 shows that each of the memory blocks BLK1 to BLKn corresponds to a single memory cell mat.

FIG. 3 shows that the memory device 100 includes a phase change random access memory (PCRAM). However, the present invention is not limited thereto. Each of the memory cells MC may include a memory element and a selection element. The memory element may include a phase change material (GST) serving as variable resistance, and the selection element may be comprised of a diode. Alternatively, a metal-oxide-semiconductor (MOS) transistor instead of the diode may be used for the selection element.

Each of the selection circuits SC1 to SCn may receive the selection signals Y1 to Y8 from the address decoder 120. Each of the selection circuits SC1 to SCn may select the bit lines BL1 to BL8 in response to the selection signals Y1 to Y8 received through the first to eighth signal lines. At least one of the selection circuits SC1 to SCn, for example, an $n^{th}$ selection circuit SCn, may be coupled to the first to eighth signal lines in a different arrangement from the other selection circuits SC1 to SCn−1.

Each of the selection circuits SC1 to SCn may include first to eighth selection transistors ST which couple the bit lines BL1 to BL8 to a corresponding column line CL. For example, a first selection circuit SC1 may include the first to eighth selection transistors ST, and the first to eighth selection transistors ST may couple the bit lines BL1 to BL8 to a first column line CL1, respectively. Similarly, the $n^{th}$ selection circuit SCn may include the first to eighth selection transistors ST, and the first to eighth selection transistors ST may respectively couple the bit lines BL1 to BL8 to an $n^{th}$ column line CLn.

In this case, the first to eighth selection transistors ST in each of the selection circuits SC1 to SCn−1 may be sequentially coupled to the first to eighth signal lines in line number order to receive the selection signals Y1 to Y8, respectively. However, the first to eighth selection transistors ST in the $n^{th}$ selection circuit SCn may be coupled to the first to eighth signal lines in a different arrangement, that is, in a different order.

The first to eighth selection transistors ST in the $n^{th}$ selection circuit SCn may be sequentially coupled to first, third, fifth, seventh, fourth, sixth, eighth and second signal lines to receive selection signals Y1, Y3, Y5, Y7, Y4, Y6, Y8 and Y2, respectively. That is, the first to eighth selection transistors ST in the $n^{th}$ selection circuit SCn may be coupled to the first to eighth signal lines by skipping a line number by "2". In this way, it is possible to skip adjacent line numbers so that there is no overlapping line numbers.

Although FIG. 3 illustrates a method of coupling the selection transistors ST in the selection circuit SCn to the signal lines by skipping a line number and coupling every "2nd" line to establish the order, the present invention is not limited thereto. In some embodiments of the present invention, the first to eighth selection transistors ST in the $n^{th}$ selection circuit SCn may be coupled to the first to eighth signal lines by skipping two line numbers and coupling every "3rd" line to establish the order. For example, the first to eighth selection transistors ST in the $n^{th}$ selection circuit SCn may be coupled to the first, fourth, seventh, second, fifth, eighth, third and sixth signal lines to receive the selection signals Y1, Y4, Y7, Y2, Y5, Y8, Y3 and Y6, respectively.

In some embodiments of the present invention, the first to eighth selection transistors ST in the $n^{th}$ selection circuit SCn may be coupled to the first to eighth signal lines by skipping the line number by "2" while the first to eighth selection transistors ST included in another selection circuit, for example, the $(n-1)^{th}$ selection circuit SCn−1 are coupled to the first to eighth signal lines by skipping the line number by "3". That is, in the by "2" arrangement, the first to eighth selection transistors ST in the $n^{th}$ selection circuit SCn may be coupled to the first, third, fifth, seventh, fourth, sixth, eighth and second signal lines to receive the selection signals Y1, Y3, Y5, Y7, Y4, Y6, Y8, and Y2, respectively, and in the by "3" arrangement, the first to eighth selection transistors ST in the $(n-1)^{th}$ selection circuit SCn−1 may be coupled to the first, fourth, seventh, second, fifth, eighth, third and sixth signal lines to receive the selection signals Y1, Y4, Y7, Y2, Y5, Y8, Y3 and Y6, respectively. In this case, the first to eighth selection transistors ST in each of the other selection circuits SC1 to SCn−2 may be sequentially coupled to the first to eighth signal lines to receive the selection signals Y1 to Y8, respectively.

When the highest numbered line is reached, wrapping may be applied to continue the order. When the order reaches the highest numbered line, the order restarts form the first numbered line. For example, the first to third selection transistors ST in the $n^{th}$ selection circuit SCn may be sequentially coupled to the first, fourth and seventh signal lines by skipping the line number by "3". Since the skipped line number order reaches the highest numbered line. i.e., the eighth signal line from the seventh signal line, the skipped line number order may restart from the first signal line. Assuming that the eighth, first and second signal lines are sequentially arranged, the fourth selection transistor may be coupled to the second signal line by skipping the line number by "3" from the seventh signal line.

When a line number which is previously coupled is selected, the wrapping order may be applied again in a direction opposite to a direction in which the line numbers increase. That is, when the greatest common divisor of the number of skipped line numbers and the number of signal lines is equal to or greater than 2, there may be an overlapping signal line while the line numbers increase. When the overlapping signal line occurs in the wrapping order, the wrapping order may restart from a signal line having a line number less than the overlapping signal line by {the skipped line numbers+1}. That is, it is possible to decrease the line numbers by subtracting the number of {the skipped line numbers+1} from the line number of the overlapping signal line.

In other words, when the first to fourth selection transistors ST in the $n^{th}$ selection circuit SCn are sequentially coupled to the first, third, fifth and seventh signal lines by skipping the line number by "2", the fifth selection transistor ST may be coupled to the first signal line again. Accordingly, the line number order may be moved to the fourth signal line in an opposite direction from the seventh signal line by the number of {the skipped line numbers (2)+1}, the fourth, sixth, eighth and second signal lines may be selected by skipping the line number by "2".

According to an embodiment of the present invention, when it is assumed that each of the memory blocks BLK1 to BLKn includes first to $N^{th}$ (where N is a natural number equal to or greater than 4) bit lines BL which are disposed adjacent to each other, each of the selection circuits SC1 to SCn may include first to $N^{th}$ selection transistors ST. Each of the selection circuits SC1 to SCn may select the bit lines BL in response to first to $N^{th}$ selection signals Yi received through first to $N^{th}$ signal lines.

When each of the first to $N^{th}$ selection transistors ST in at least one selection circuit, for example, SCn, is coupled to the first to $N^{th}$ signal lines by skipping the line number by "K" (where K is a natural number greater than 1 and equal to or less than {N/2-1}), each of the first to $N^{th}$ selection transistors ST in the other selection circuits SC1 to SCn−1 may be sequentially coupled to the first to $N^{th}$ signal lines in line number order. In other words, when first and second selection transistors ST in the other selection circuits SC1 to SCn−1 receive first and second selection signals, respectively, first and second selection transistors ST in the selection circuit SCn may receive first and $(K+1)^{th}$ selection signals, respectively.

Figure 4:
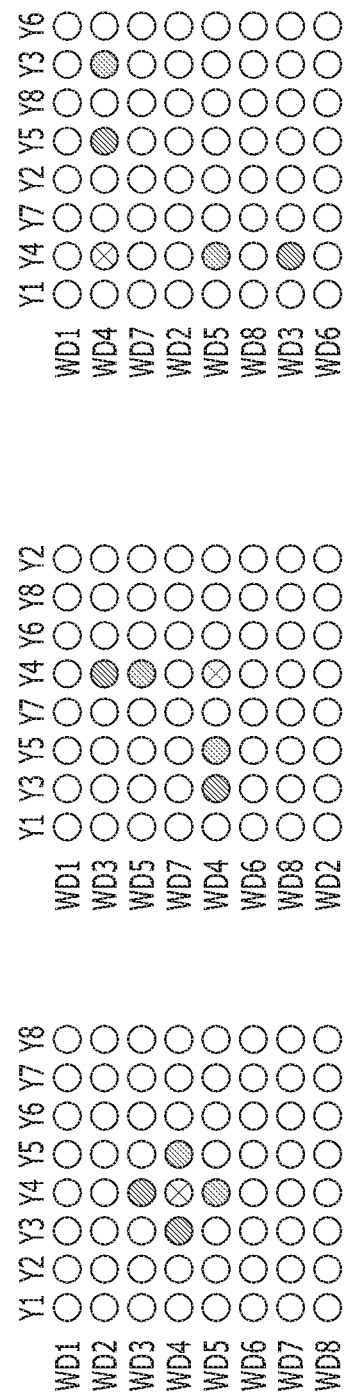
FIG. 4 is a diagram illustrating an operation of a memory device in accordance with an embodiment of the present invention.

FIG. 4 is a diagram illustrating an operation of a memory device in accordance with an embodiment of the present invention. Although it is described as an example that the memory device is comprised of 8×8 memory cell mats, the present invention is not limited thereto.

As described above, the memory device may include memory cells MC arranged in the form of the matrix in the intersection regions of the word lines and the bit lines. That is, FIG. 4 shows a plurality of memory regions in units of memory cells coupled between eight word lines and eight bit lines.

According to embodiments of the present invention, a coupling relationship of the bit lines may be different for each memory region. Also, a coupling relationship of the word lines may be different for each memory region. By way of example, it is described that the coupling relationship of the word lines as well as the coupling relationship of the bit lines is different for each memory region.

Referring to FIG. 4, eight word line driving signals WD1 to WD8 and eight bit line selection signals Y1 to Y8 may be used to select one of the memory cells having an 8×8 matrix structure. The address decoder 120 may decode the row and column addresses to generate the word line driving signals WD1 to WD8 and the bit line selection signals Y1 to Y8. When a single word line is activated based on the word line driving signals WD1 to WD8, one of the memory cells coupled to the activated word line may be selected based on the bit line selection signals Y1 to Y8, and data may be read and/or written from/to the selected memory cell.

Signal lines for applying the word line driving signals WD1 to WD8 and/or the bit line selection signals Y1 to Y8 may be arranged differently for each memory region. It may be seen in a first memory region at the left of FIG. 4 that the first to eighth word line driving signals WD1 to WD8 and bit line selection signals Y1 to Y8 sequentially correspond to neighboring word lines and bit lines, respectively. For example, a selection circuit corresponding to the first memory region may sequentially select the neighboring bit lines in response to the first to eighth bit line selection signals Y1 to Y8.

It may be seen in a second memory region at the center of FIG. 4 that the first, third, fifth, seventh, fourth, sixth, eighth and second word line driving signals WD1, WD3, WD5, WD7, WD4, WD6, WD8 and WD2 and bit line selection signals Y1, Y3, Y5, Y7, Y4, Y6, Y8 and Y2 sequentially correspond to neighboring word lines and bit lines, respectively. For example, a selection circuit corresponding to the second memory region may sequentially select the neighboring bit lines in response to the first, third, fifth, seventh, fourth, sixth, eighth and second bit line selection signals Y1, Y3, Y5, Y7, Y4, Y6, Y8 and Y2.

Lastly, it may be seen in a third memory region at the right of FIG. 4 that the first, fourth, seventh, second, fifth, eighth, third and sixth word line driving signals WD1, WD4, WD7, WD2, WD5, WD8, WD3 and WD6 and bit line selection signals Y1, Y4, Y7, Y2, Y5, Y8, Y3 and Y6 sequentially correspond to neighboring word lines and bit lines, respectively. For example, a selection circuit corresponding to the third memory region may sequentially select the neighboring bit lines in response to the first, fourth, seventh, second, fifth, eighth, third and sixth bit line selection signals.

FIG. 4 shows an operation of writing data to four memory cells by decoding the row and column addresses by the address decoder 120. In other words, the address decoder 120 of FIG. 1 may generate the third word line driving signal WD3 and the fourth bit line selection signal Y4 to write data to a first memory cell, and generate the fourth word line driving signal WD4 and the third bit line selection signal Y3 to write data to a second memory cell. In addition, the address decoder 120 may generate the fourth word line driving signal WD4 and the fifth bit line selection signal Y5 to write data to a third memory cell, and generate the fifth word line driving signal WD5 and the fourth bit line selection signal Y4 to write data to a fourth memory cell.

An order in which such a write operation is performed on the first to fourth memory cells may be varied. However, while the write operation is performed on the four memory cells, a disturbance phenomenon may occur in neighboring memory cells due to the write operation. Particularly, a memory cell adjacent to all the four memory cells in the first memory region, that is, a memory cell corresponding to the fourth word line driving signal WD4 and fourth bit line selection signal Y4 may be affected by the write operation which is performed four times.

If the signal lines for applying the word line driving signals WD1 to WD8 and/or the bit line selection signals Y1 to Y8 are arranged in the same manner in a plurality of memory regions, the memory cells corresponding to the fourth word line driving signal WD4 and fourth bit line selection signal Y4 even in remaining memory regions other than the first memory region may be affected by the write operation which is performed four times. Generally, in order to prevent the disturbance phenomenon, when the write operation is performed a predetermined number of times or more, a scrubbing operation of reading data and rewriting the read data to the same memory region may be performed. During the scrubbing operation, an error occurring in the data may be corrected using an error correction code (ECC). However, when the memory cells corresponding to the fourth word line driving signal WD4 and fourth bit line selection signal Y4 in the plurality of memory regions are affected by the write operation, an uncorrectable error (i.e., exceeding a number of error bits which are correctable through the ECC) may occur.

According to embodiments of the present invention, the signal lines for applying the word line driving signals WD1 to WD8 and/or the bit line selection signals Y1 to Y8 may be arranged differently for each memory region. Accordingly, as shown in FIG. 4, there is no common memory cell adjacent to four memory cells on which the write operation is performed, in each of second and third memory regions differently from the first memory region.

As a result, a memory cell corresponding to the fourth word line driving signal WD4 and fourth bit line selection signal Y4 in each of the second and third memory regions differently from the first memory region may not be affected by the write operation which is performed four times. Accordingly, the memory cells corresponding to the fourth word line driving signal WD4 and fourth bit line selection signal Y4 in the plurality of memory regions may be prevented from being affected by the write operation, and even though an error occurs, the error may be equal to or lower than the bits which are correctable through the ECC.

A line arrangement of the word line driving signals WD1 to WD8 and/or the bit line selection signals Y1 to Y8 may be varied with the number of bits which are correctable through the ECC. For example, when the number of bits which are correctable through the ECC is 64, the line arrangement of the word line driving signals WD1 to WD8 and/or the bit line selection signals Y1 to Y8 may be different for each of 64 memory regions. As the number of different line arrangements of the word line driving signals WD1 to WD8 and/or the bit line selection signals Y1 to Y8 increases, error occurrence may be distributed more stably.

In addition, the line arrangement of the word line driving signals WD1 to WD8 and/or the bit line selection signals Y1 to Y8 may be varied at random. As described earlier according to an embodiment of the present invention, the signal lines for applying the word line driving signals WD1 to WD8 and/or the bit line selection signals Y1 to Y8 may be arranged adjacent to each other by skipping a predetermined number of line numbers for each memory region. The signal lines may be arranged adjacent to each other by skipping the line number by "2" or "3". When the signal lines are arranged adjacent to each other by skipping half or more of the total number of line numbers, overlapping line arrangements may occur. This is because a line arrangement in which the signal lines are adjacent to each other by skipping the line number by "3" and a line arrangement in which the signal lines are adjacent to each other by skipping the line number by "5" may be overlapped.

In accordance with embodiments of the present invention, while hot and cold memory blocks of a memory device are detected and swapped based on a number of times that a write operation is performed, the hot memory block may be prevented from moving to a specific region of the memory device. Accordingly, a read disturbance phenomenon may be prevented from occurring due to the hot memory block. As it is selectively determined considering a number of times that a read operation is performed that the hot memory block moves to the specific region, efficiency of a wear-leveling operation may increase.

In addition, the cold memory block may be disposed in a specific region of the memory device based on the number of times that the read operation is performed. Accordingly, during the read operation, it is possible to reduce a bit error rate and a number of times that an ECC operation or a scrubbing operation is performed.

In accordance with embodiments of the present invention, an increase in memory cells affected by a disturbance phenomenon as data is read/written in the same pattern in a plurality of memory regions as well as an increase in a bit error rate may be prevented. To this end, data corresponding to the same address in each of the memory regions may be stored in a memory cell which is disposed at a physically different location. Accordingly, although the disturbance phenomenon occurs due to such read/write operations, the disturbance phenomenon may be limited within some regions of the memory regions, that is, within a range which is correctable through an ECC operation.

As an error attributable to the disturbance phenomenon is limited to some data rather than entire data, efficiency of a scrubbing operation may increase. Accordingly, conditions for the read/write operations for determining the disturbance phenomenon may be eased, and a number of times that the scrubbing operation may be reduced, whereby an operational load or power consumption of the memory device may decrease.

While the present invention has been described with respect to specific embodiments, these embodiments are not intended to be restrictive, but rather descriptive. Further, it is noted that the present invention may be achieved in various ways through substitution, change, and modification, as will be apparent to those skilled in the art in light of this disclosure, without departing from the spirit and/or scope of the present invention as defined by the following claims.

What is claimed is:

1. A memory device, comprising:
   a plurality of memory regions including memory cells coupled between a plurality of word lines and a plurality of bit lines;
   an address decoder suitable for decoding an address to generate a plurality of selection signals corresponding to the bit lines, and outputting the selection signals to a plurality of signal lines; and
   a plurality of selection circuits corresponding to the memory regions, respectively, and suitable for selecting the bit lines in response to the selection signals received through the signal lines,
   wherein at least one of the selection circuits is coupled to the signal lines in an arrangement different from remaining selection circuits, and
   wherein each of the selection circuits receives all the selection signals through the same signal lines.

2. The memory device of claim 1, wherein the plurality of bit lines include first to $N^{th}$ bit lines which are disposed adjacently in order, where N is a natural number equal to or greater than 4.

3. The memory device of claim 2,
   wherein each of the selection circuits includes first to $N^{th}$ selection transistors which correspond to the first to $N^{th}$ bit lines, respectively, the plurality of selection signals include first to $N^{th}$ selection signals, and the plurality of signal lines include first to $N^{th}$ signal lines,
   wherein the address decoder generates the first to $N^{th}$ selection signals which respectively correspond to the first to $N^{th}$ bit lines, and outputs the first to $N^{th}$ selection signals to the first to $N^{th}$ signal lines.

4. The memory device of claim 3, wherein when the first to $N^{th}$ selection transistors included in the remaining selection circuits are sequentially coupled to the first to $N^{th}$ signal lines, respectively, in line number order, the first to $N^{th}$ selection transistors included in the at least one of the selection circuits are coupled to the first to $N^{th}$ signal lines, respectively, in line number order skipped by K, which is a natural number greater than 1 and equal to or less than N/2−1.

5. The memory device of claim 4, wherein the first to $N^{th}$ selection transistors included in the at least one of the selection circuits are coupled to the first to $N^{th}$ signal lines in a wrapping order where the skipped line number order restarts from the first signal line when the skipped line number order reaches the $N^{th}$ signal line.

6. The memory device of claim 5, wherein when a greatest common divisor of K and N is equal to or greater than 2, and an overlapping signal line occurs in the wrapping order, the skipped line number order restarts from a signal line having a line number less than the overlapping signal line by K+1.

7. The memory device of claim 3, wherein when the first and second selection transistors included in the remaining selection circuits receive the first and second selection signals, respectively, the first and second selection transistors included in the at least one of the selection circuits receive the first and $(K+1)^{th}$ selection signals, respectively, where K is a natural number greater than 1 and equal to or less than N/2−1.

8. The memory device of claim 1, wherein the plurality of bit lines include first to eighth bit lines which are disposed adjacently in order.

9. The memory device of claim 8,
wherein each of the selection circuits includes first to eighth selection transistors which correspond to the first to eighth bit lines, respectively, and the plurality of signal lines includes first to eighth signal lines,
wherein the address decoder generates first to eighth selection signals corresponding to the first to eighth bit lines, and outputs the first to eighth selection signals to the first to eighth signal lines.

10. The memory device of claim 9, wherein the at least one of the selection circuits includes at least one of:
a first selection circuit in which the first to eighth selection transistors are coupled to the first, third, fifth, seventh, fourth, sixth, eighth and second signal lines, respectively; and
a second selection circuit in which the first to eighth selection transistors are coupled to the first, fourth, seventh, second, fifth, eighth, third and sixth signal lines, respectively.

11. A memory device, comprising:
a plurality of memory regions including memory cells coupled between N word lines and N bit lines, where N is a natural number equal to or greater than 3;
an address decoder suitable for decoding an address to generate first to $N^{th}$ selection signals corresponding to the bit lines; and
a plurality of selection circuits corresponding to the memory regions, respectively, and suitable for selecting the bit lines in response to the first to $N^{th}$ selection signals,
wherein the selection circuits include:
a first selection circuit suitable for selecting neighboring bit lines among the bit lines in response to first and second selection signals among the first to $N^{th}$ selection signals; and
a second selection circuit suitable for selecting neighboring bit lines among the bit lines in response to the first selection signal and a $(K+1)^{th}$ selection signal among the first to $N^{th}$ selection signals, where K is a natural number greater than 1 and equal to or less than N/2−1.

12. The memory device of claim 11,
wherein each of the selection circuits includes first to $N^{th}$ selection transistors which correspond to the N bit lines, respectively, and
wherein the address decoder outputs the first to $N^{th}$ selection signals to first to $N^{th}$ signal lines, respectively.

13. The memory device of claim 12, wherein when the first to $N^{th}$ selection transistors of the first selection circuit are sequentially coupled to the first to $N^{th}$ signal lines, respectively, in line number order, the first to $N^{th}$ selection transistors of the second selection circuit are coupled to the first to $N^{th}$ signal lines, respectively, in line number order skipped by K.

14. The memory device of claim 13, wherein the first to $N^{th}$ selection transistors of the second selection circuit are coupled to the first to $N^{th}$ signal lines in a wrapping order where the skipped line number order restarts from the first signal line when the skipped line number order reaches the $N^{th}$ signal line.

15. The memory device of claim 14, wherein when a greatest common divisor of K and N is equal to or greater than 2, and an overlapping signal line occurs in the wrapping order, the skipped line number order restarts from a signal line having a line number less than the overlapping signal line by K+1.

16. The memory device of claim 11, wherein when the bit lines include first to eighth bit lines which are disposed adjacently in order, the first selection circuit selects the first to eighth bit lines in response to first to eighth selection signals.

17. The memory device of claim 16, wherein the second selection circuit selects the first to eighth bit lines in response to the first, third, fifth, seventh, fourth, sixth, eighth and second selection signals, respectively.

18. The memory device of claim 16, wherein the second selection circuit selects the first to eighth bit lines in response to the first, fourth, seventh, second, fifth, eighth, third and sixth selection signals, respectively.

19. A method of operating a memory device having a plurality of memory regions, the method comprising:
decoding an address, using an address decoder, to generate a plurality of selection signals respectively corresponding to a plurality of bit lines;
outputting the selection signals to a plurality of signal lines; and
selecting the bit lines in response to the selection signals received through the signal lines,
wherein at least one of a plurality of selection circuits, which respectively correspond to the plurality of memory regions, is coupled to the signal lines in an arrangement different from remaining selection circuits,
wherein each of the selection circuits receives all the selection signals through the same signal lines.

* * * * *